United States Patent
Parks et al.

[11] Patent Number: 5,862,369
[45] Date of Patent: Jan. 19, 1999

[54] METHOD AND APPARATUS FOR STATE MACHINE OPTIMIZATION USING DEVICE DELAY CHARACTERISTICS

[75] Inventors: Terry J. Parks, Round Rock; Darius D. Gaskins, Austin, both of Tex.

[73] Assignee: Dell USA, L.P., Round Rock, Tex.

[21] Appl. No.: 709,239

[22] Filed: Sep. 3, 1996

Related U.S. Application Data

[63] Continuation of Ser. No. 444,445, May 19, 1995, abandoned, Continuation-in-part of Ser. No. 816,313, Dec. 30, 1991, Pat. No. 5,245,231.

[51] Int. Cl.$^6$ .................................................. G06F 1/04
[52] U.S. Cl. ............................................................ 395/558
[58] Field of Search .................................. 395/552, 555, 395/558, 559, 556, 557, 560

[56] References Cited

U.S. PATENT DOCUMENTS

| | | | |
|---|---|---|---|
| 4,079,456 | 3/1978 | Lunsford et al. | 395/52 |
| 4,482,863 | 11/1984 | Auston et al. | 324/158 T |
| 4,559,636 | 12/1985 | Goldrian | 377/20 |
| 4,641,246 | 2/1987 | Halbert et al. | 364/487 |
| 4,807,147 | 2/1989 | Halbert et al. | 364/487 |
| 4,851,998 | 7/1989 | Hospodor | 364/300 |
| 4,979,177 | 12/1990 | Jackson | 377/20 |
| 5,138,320 | 8/1992 | Ngo et al. | 341/173 |
| 5,180,937 | 1/1993 | Laird et al. | 307/602 |
| 5,228,066 | 7/1993 | Devane | 377/20 |
| 5,245,231 | 9/1993 | Kocis et al. | 307/606 |
| 5,253,352 | 10/1993 | Olson | 395/425 |
| 5,268,656 | 12/1993 | Muscavage | 331/45 |
| 5,272,390 | 12/1993 | Watson et al. | 307/269 |
| 5,272,729 | 12/1993 | Bechade et al. | 375/118 |
| 5,282,213 | 1/1994 | Leigh et al. | 371/22.1 |
| 5,572,715 | 11/1996 | Gowni | 395/555 |

OTHER PUBLICATIONS

Cox et al. "VLSI performance compensation for off–chip drivers and clock generation", Proceedings of the IEEE 1989 Custom Integrated Circuits Conference (Cat. No. 89Ch2671–6), p. 14.3/1–4, May 18, 1989.

*Primary Examiner*—Alvin E. Oberley
*Assistant Examiner*—St. John Courtenay, III
*Attorney, Agent, or Firm*—Skjerven, Morrill, MacPherson, Franklin & Friel, L.L.P.; Stephen A. Terrile

[57] ABSTRACT

A method and apparatus which enables circuitry to detect and take advantage of the intrinsic performance or delay characteristic of the respective device in which the circuitry is embedded. By determining the delay characteristics of the device and sampling signals based on this information, the circuitry may not be required to wait for additional clock cycles which is required for logic in prior art devices which do not take advantage of the device's intrinsic performance. This considerably increases device performance. A device delay encoder circuit included in a device encodes the instantaneous delay coefficient of the device in question and a clocking signal is used to determine whether the delay elements should be considered fast or slow. All of the logic circuitry on a chip have a similar derating factor, and thus the performance of the delay elements is indicative of the performance of the entire chip. The encoded device delay information is then used by logic circuitry in the respective device on that cycle to determine when to sample Therefore, where a respective device has a small delay coefficient, and the device includes logic according to the present invention, the device can perform operations in a reduced number of clock cycles. This significantly increases device performance.

19 Claims, 5 Drawing Sheets

METHOD AND APPARATUS FOR STATE MACHINE OPTIMIZATION USING DEVICE DELAY CHARACTERISTICS

This application is a continuation of application Ser. No. 08/444,445, filed May 19, 1995 now abandoned.

This is also a Continuation-in-Part of U.S. patent application Ser. No. 07/816,313 titled "Integrated Delay Line" which was filed Dec. 30, 1991 whose inventors are Thomas J. Kocis and Darius D. Gaskins and which issued on Sep. 14, 1993 as U.S Pat. No. 5,245,231.

FIELD OF THE INVENTION

The present invention relates to device operations in computer systems, and more specifically to a method and apparatus which enables circuitry in a device to detect and take advantage of individual device performance variations, thus improving hardware performance.

DESCRIPTION OF THE RELATED ART

Computer systems generally comprise a plurality of different devices or chips which interconnect to perform desired functions. As a result of the fabrication process involved, each of the various logic circuitry comprised on a chip includes a similar derating factor. In other words, the various logic circuitry comprised on a chip operate "in sync" and thus will all be categorized as either having a fast, medium or slow speed. Thus, the entire chip may generally be categorized as either fast, medium or slow compared to other chips. This is caused by process variation and differences between voltage and temperature, among other factors.

Computer systems typically use state transition logic or other synchronous circuitry to implement desired functions. However, current state machine implementations are generally not optimized for individual device performance variations. Current state transition logic is typically designed to function at worst case device performance levels, and the resulting state machine performance is consequently suboptimal. This problem occurs when a signal path exists through state transition logic which, under worst case conditions, takes longer to propagate than the period of the system clock. However, under actual operating conditions, such as in a "fast" chip, the propagation time may be much less than one period of the system clock. When this occurs, state transition logic is forced to wait an additional clock cycle to sample the output of this path. Depending on actual operating conditions, this delay may not be necessary. Therefore, a method and apparatus is desired which enables logic circuitry to take full advantage of the intrinsic performance of the device in which the logic is embedded and thus increases device performance.

SUMMARY OF THE INVENTION

The present invention comprises a simple and reliable method and apparatus which enables circuitry to detect and take advantage of the intrinsic performance or delay characteristics of the respective device in which the circuitry is embedded. By determining the delay characteristics of the device and sampling signals based on this information, the circuitry can sometimes avoid having to wait for additional clock cycles. These additional clock cycles are always required for logic in prior art devices which do not take advantage of the device's intrinsic performance. Thus, the present invention considerably increases device performance.

A device delay encoder circuit included in a device encodes the instantaneous delay coefficient of the device in question. The device delay encoder includes a number of delay elements connected serially such that the output of one delay element is connected to the input of the next and so on. The outputs of each of the delay elements are connected to D-type flip-flops. A clocking signal used on the device is provided to the input of the first delay element and is also provided to the clock inputs of each of the flip-flops. At each rising edge of the clocking signal, the prior falling edge will have propagated through a certain number of delay elements. An encoder analyzes the contents of the flip-flops at each rising edge to determine how many delay elements through which the falling edge has propagated and thus whether the delay elements should be considered fast or slow. As discussed in the background, all of the logic circuitry on a chip has a similar derating factor, and thus the performance of the delay elements is indicative of the performance of the entire chip. A certain threshold is chosen such that if the preceding falling edge has propagated through a certain number of delay elements by the next rising edge, the chip is considered fast. Otherwise the chip is considered slow. The encoded device delay information is then used by logic circuitry in the respective device on that cycle to determine when to sample respective internal signals.

In one embodiment, the present invention is incorporated into a cache controller's cache hit logic. In this embodiment, it is assumed that zero wait state tag compare cycles are possible under fast operating conditions, i.e. a fast chip with a small delay coefficient, and one wait state is required for a slow chip with a larger delay coefficient. The device delay encoder samples the device delay characterization on each clock cycle rising edge and categorizes the device as either fast or slow depending on a certain threshold. The cache hit logic in the cache controller uses the device delay information in determining when to sample for a cache memory hit and return a bus ready signal in response to the address strobe signal output from the CPU. If a small device delay is detected, then it is assumed that the tag compare cycle is performed quickly, and the bus ready signal is returned in zero wait states. If a large device delay is detected, then a wait state is used to delay assertion of the bus ready signal for an additional cycle, thus allowing more time to sample for a cache hit. Therefore, where a respective device has a small delay coefficient, and the device includes logic according to the present invention, the device can perform operations in a reduced number of clock cycles. This significantly increases device performance.

BRIEF DESCRIPTION OF THE DRAWINGS

A better understanding of the present invention can be obtained when the following detailed description of the preferred embodiment is considered in conjunction with the following drawings, in which.

DETAILED DESCRIPTION OF THE PREFERRED EMBODIMENT

Figure 1:
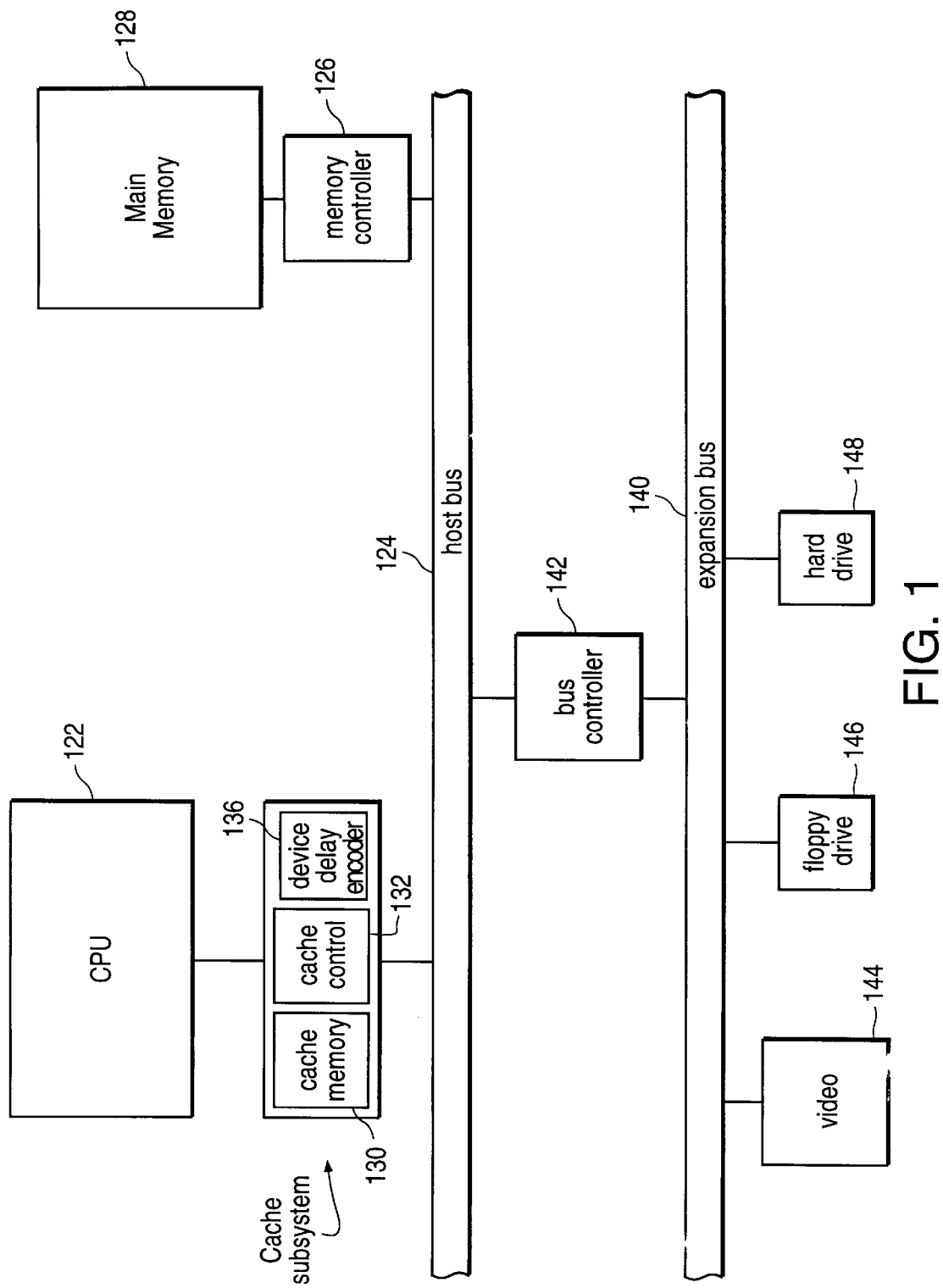
FIG. 1 illustrates a computer system according to the preferred embodiment of the invention.

Referring now to FIG. 1, a computer system incorporating logic according to the present invention is shown. The elements of a computer system not necessary to understand the operation of the present invention have been omitted for simplicity. The computer system includes a central processing unit or CPU 122 which is coupled to a memory or host bus 124. The CPU 122 preferably includes a cache subsystem coupled between the CPU 122 and host bus 124. The cache subsystem comprises cache memory 130 and a cache controller 132. The cache subsystem also includes a device delay encoder 136 according to the present invention which determines the instantaneous delay coefficient of the cache subsystem and categorizes the delay accordingly. The cache controller 132 uses this encoded device delay information in the preferred embodiment to reduce the number of clock cycles required for tag compare operations according to the present invention, as discussed below.

The host bus 124 includes address, data, and control portions. Main memory 128 is coupled to the host bus 124 by means of memory controller 126. The host bus 124 is coupled to an expansion or input/output (I/O) bus 140 by means of a bus controller 142. The expansion bus 140 includes slots for various other devices, including video 144, a floppy drive 146 and hard drive 148.

In the embodiment shown in FIG. 1, the device delay encoder logic 136 is shown incorporated into a cache subsystem. However, it is noted that the logic of the present invention can be incorporated into any of the devices illustrated in FIG. 1 as well as other devices not shown in FIG. 1. In this embodiment, it is assumed that zero wait state access to tag memory in the cache subsystem is possible under fast operating conditions, i.e. a small delay coefficient, and one wait state is required for a chip which has a larger inherent delay. The device delay encoder 136 determines the device delay coefficient of the cache subsystem on each clock cycle and categorizes the delay accordingly.

As discussed in the background, all of the logic circuitry on a chip have a similar derating factor, and thus the performance of certain logic elements on the chip is indicative of the performance of the entire chip. Thus the device delay encoder 136 determines the signal propagation delay through certain logic elements on the chip, delay elements according to the preferred embodiment, and categorizes the delay characteristic accordingly. The encoded device delay characterization information is then used by the respective device on that cycle to determine when to sample respective internal signals.

Figure 2:
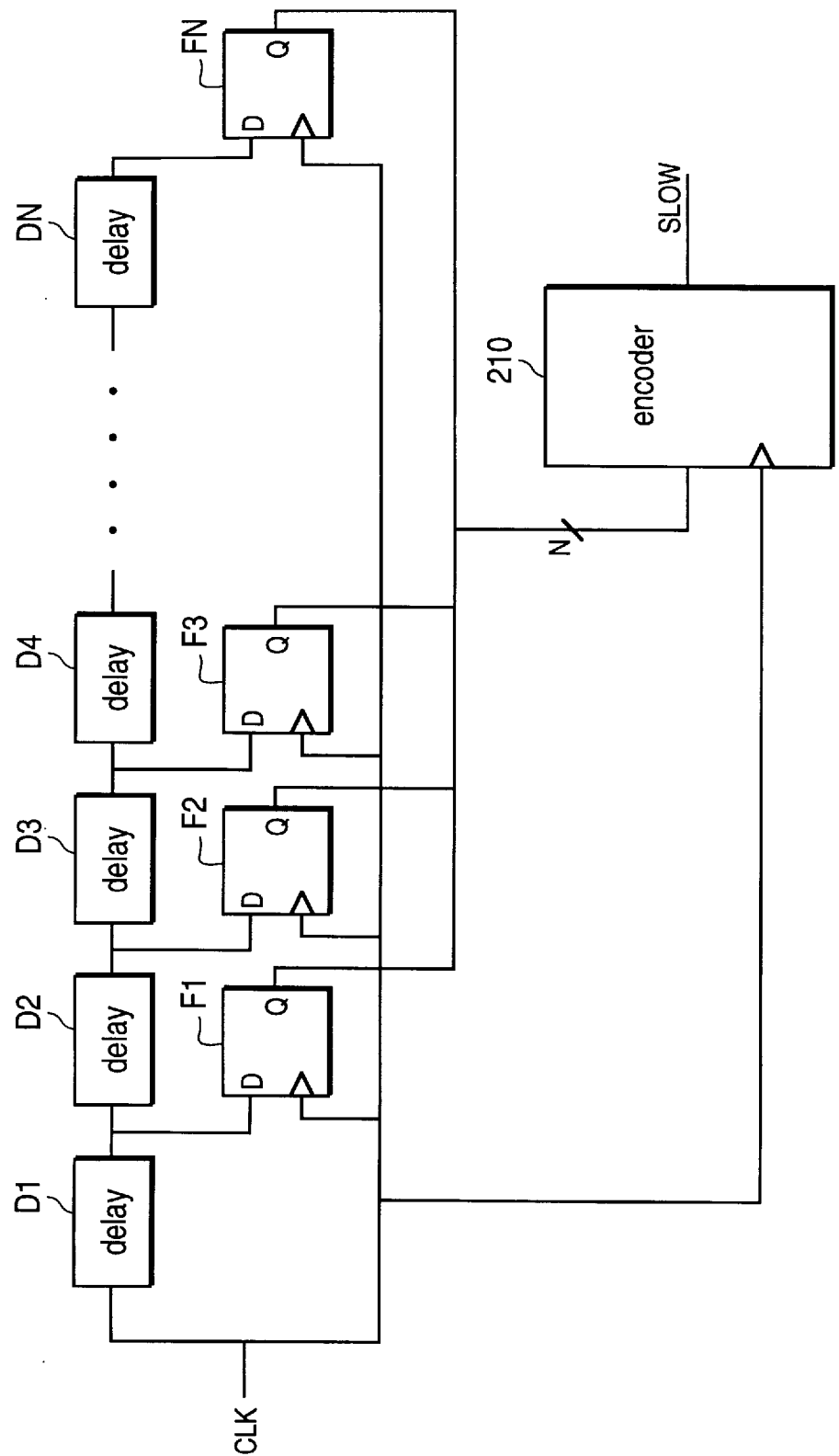
FIG. 2 illustrates a device delay encoder according to the preferred embodiment of the invention.

Referring now to FIG. 2, the device delay encoder 136 according to the preferred embodiment of the invention is shown. The device delay encoder 136 includes a plurality of delay elements D1–DN connected together whereby the output of one delay element is connected to the input of the next delay element and so on. In the preferred embodiment, 10 delay elements D1–D10 are used which each provide a one nanosecond (ns) delay under best case operating conditions, and which provide a delay that ranges between 1 and 3 nanoseconds under normal operating conditions. However, more or less delay elements may be used depending on the desired degree of precision or granularity, the amount of delay provided by each delay element, and the timing of the device being detected.

An internal cache subsystem clocking signal referred to as CLK is connected to the input of the first delay element D1, as shown. The CLK signal preferably has a period of 20 ns, and preferable has a 50% duty cycle. The outputs of each of the delay elements D1–D10 are connected to corresponding D-type flip-flops F1–F10 as shown. The CLK signal is also connected to the clock input of each of the flip-flops F1–F10. The Q outputs of each of the flip-flops F1–F10 are connected to an encoder 210. The encoder 210 also receives the CLK signal.

At the rising edge of the CLK signal, the encoder 210 analyzes which of the signals output from the flip-flops F1–Fl0 are asserted. The encoder 210 outputs a signal or bit referred to as SLOW which reflects the delay characterization of the device. Thus only the coarsest granularity is detected in the preferred embodiment. However, it is noted that finer granularity can be detected, as desired. Depending on the complexity of the encoder 210 the categorization may be of arbitrary precision. Also, depending on the device and the processing technology involved, there may be limits to the number of categories which can be accurately discerned.

In the preferred embodiment, if the falling edge of the CLK signal propagated through 7 or more delay elements, i.e. through at least delay element D7, by the next rising edge, then the SLOW signal is negated. This indicates a fast device, i.e., a fast cache subsystem. In other words, if the encoder 210 sees 0000000111, 0000000011, etc. output from the flip-flops F1–F10, then the cache subsystem is characterized as fast. In this instance, the cache state tracker logic (FIG. 5) can sample a cache memory hit signal, referred to as CACHE_HIT, and assert the BRDYn signal on the next CLK signal edge. If the falling edge of the CLK signal has propagated through 6 or less delay elements, i.e. the data output from the flip-flops F1–F10 is 0000001111, 0000011111, etc., then the SLOW signal is asserted and the cache system is categorized as slow. In this instance, the cache state tracker logic is required to insert a wait state to wait an additional CLK signal cycle for the tag compare cycle to complete before sampling the CACHE_HIT signal and returning the BRDYn signal.

For more information on alternative embodiments of the device delay encoder 136 used in the present invention, please see related co-pending application Ser. No. 07/816, 313 titled "Integrated Delay Line", now U.S. Pat. No. 5,245,231, now U.S. Pat. No. 5,245,231, which is assigned to the same assignee as the present application, and which is hereby incorporated by reference.

Figure 3:
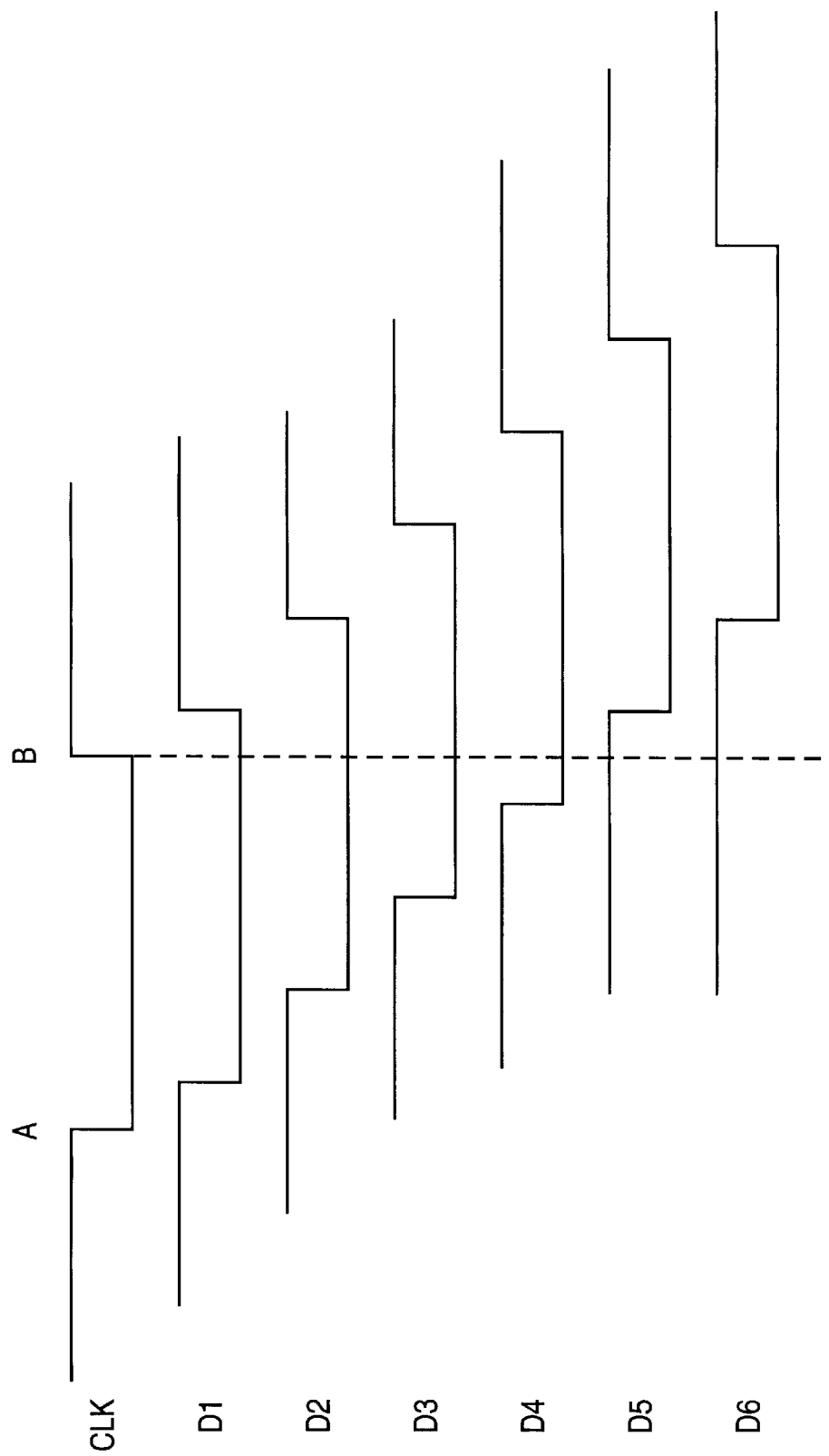
FIG. 3 is a timing diagram illustrating operation of the device delay encoder of FIG. 2 in a fast device.

Referring now to FIG. 3, a timing diagram illustrating operation of the device delay encoder 236 of FIG. 2 for a slow device is shown. FIG. 3 illustrates a portion of a CLK signal cycle as well as the outputs from respective delay elements D1–D6. The outputs from delay elements D7–D10 are not shown for convenience. As shown, the falling edge of the CLK signal cycle occurs at point A. This falling edge begins propagating through the delay elements D1–D10. On the subsequent rising edge of the CLK signal at point B, the respective flip-flops F1–F10 latch in the value output from the respective delay elements D1–D10. As shown in FIG. 3, the delay elements D1–D4 reflect a logic low value. This represents a slow cache subsystem chip since the falling edge of the CLK signal, which occurs at point A, has propagated through only four delay elements D1–D4 before the subsequent rising edge at point B. The output of the flip-flops F1–F10 in this situation would be 0000111111. The encoder 210 accordingly asserts the SLOW signal to reflect that the cache subsystem is slow.

Figure 4:
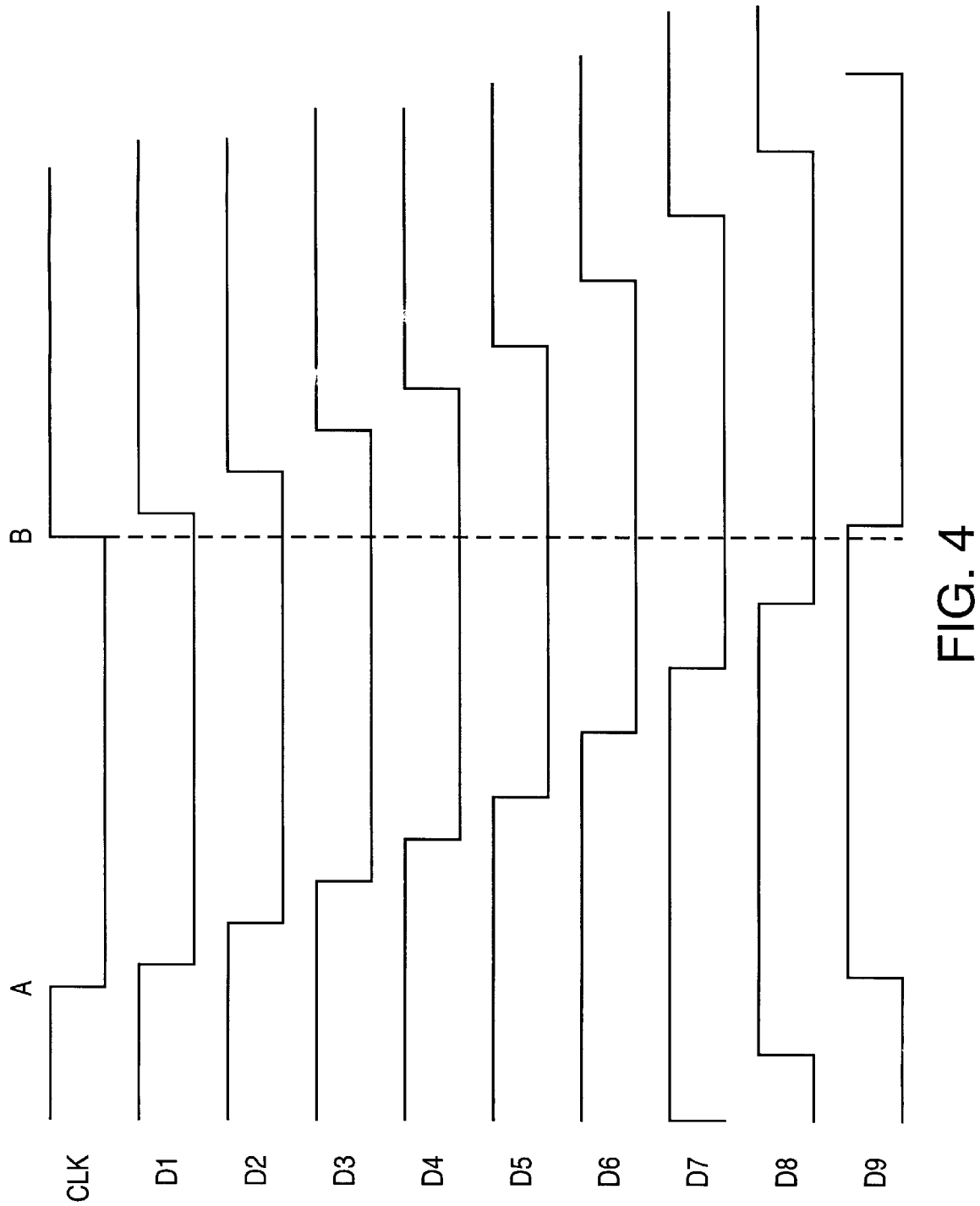
FIG. 4 is a timing diagram illustrating operation of the device delay encoder of FIG. 2 in a slow device.

Referring now to FIG. 4, a second timing diagram illustrating operation of a fast device is shown. FIG. 4 illustrates the outputs from delay elements D1–D9, with the output from delay element D10 not shown for convenience. As with FIG. 3, the falling edge of the CLK signal occurs at point A. This falling edge begins to propagate through the delay elements D1–D10. At the subsequent rising edge of the CLK signal at point B, the outputs of the delay elements D1–D8 are all a logic low value with the remaining delay elements D9–D10 reflecting a logic high value. This indicates that the CLK signal was delayed very little and managed to propagate through the delay elements D1–D8 between point A and point B. Thus the output produced by the flip-flops F1–FN would reflect 0000000011 indicating a fast cache subsystem chip. Thus the encoder 210 negates the SLOW signal to reflect that the cache subsystem is fast.

Figure 5:
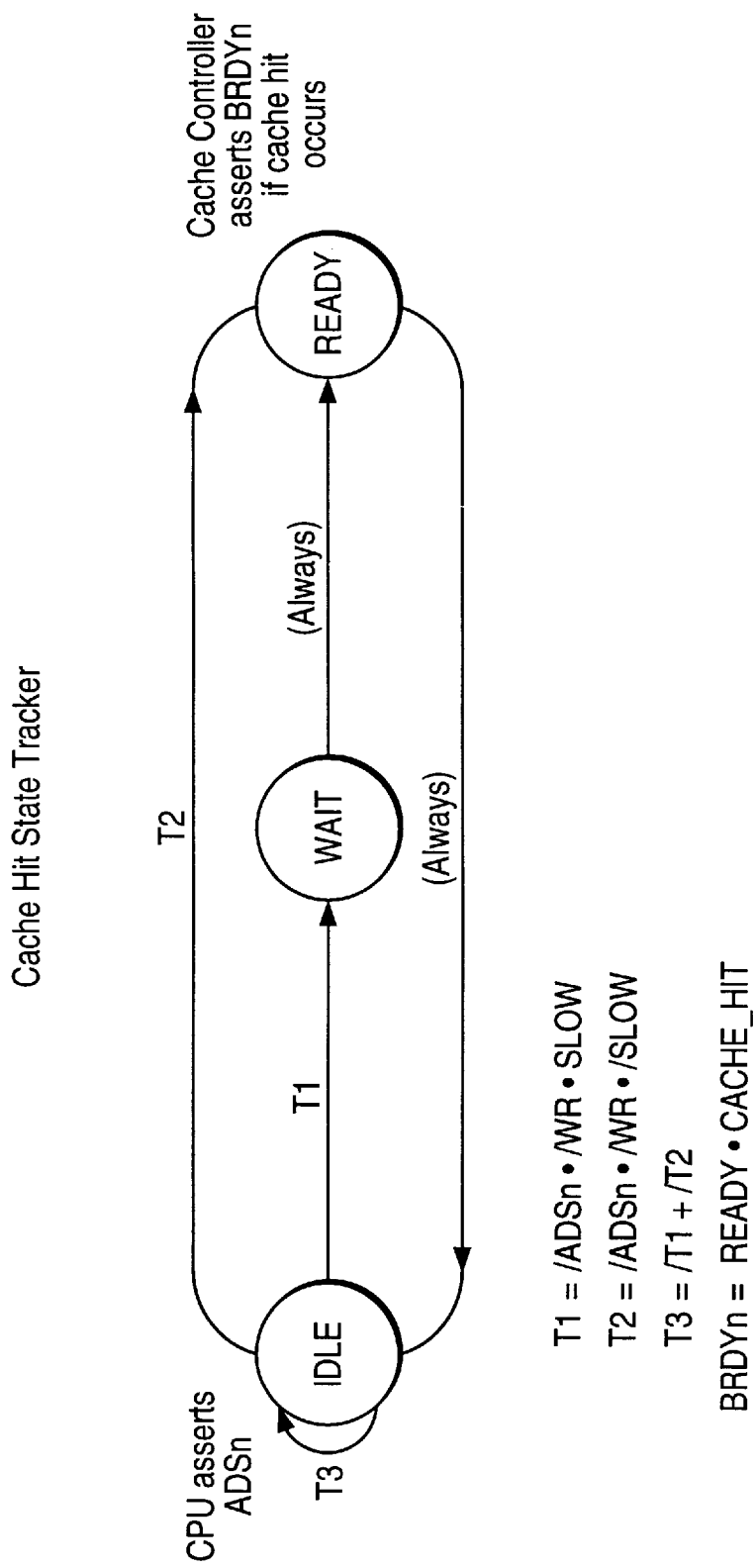
FIG. 5 is a state transition diagram illustrating operation of cache hit state tracker logic utilizing the encoded delay characterization information produced by the device delay encoder of FIG. 2.

Referring now to FIG. 5, a state transition diagram illustrating operation of cache hit state tracker logic in the cache controller 132 of FIG. 1 is shown. The cache hit logic is normally in the IDLE state and remains in the IDLE state while the condition /T1+/T2 is true. In other words, the cache hit logic remains in its IDLE state when the address strobe signal ADSn is negated or a write cycle is occurring. The cache hit logic advances from its IDLE state to its READY state if the condition:

/ADSn•/WR•/SLOW is true. Thus the cache hit logic advances directly to the READY state if the ADSn signal is asserted low, the WR signal is negated, indicating a READ cycle, and the SLOW signal is also negated, indicating that the cache subsystem is fast or has a small delay characteristic. In the READY state, the cache controller 132 samples the CACHE_HIT signal, and the bus ready signal (BRDYn) is asserted if a cache hit occurs, signified by the CACHE_HIT signal being asserted.

The cache hit logic advances from its IDLE state to the WAIT state if the condition:

/ADSn•/WR•SLOW is true. Thus, the cache hit logic advances from its IDLE state to its WAIT state when the ADSn signal is asserted low on a READ cycle and the device delay information indicates a slow cache subsystem. The WAIT state is used to provide additional time for the tag compare cycle to be performed in the chip. The cache hit logic advances from its WAIT state to its READY state on the next CLK signal cycle. In the READY state, the cache controller 132 samples the CACHE_HIT signal, and the BRDYn signal is asserted if a cache hit occurs. The cache hit logic returns from its READY state back to its IDLE state on the next CLK signal cycle and waits for a new ADSn signal to be asserted.

Therefore, the cache hit logic in the cache controller 132 uses the device delay characterization information represented by the SLOW signal to determine the delay characterization of the cache subsystem, i.e. whether the cache subsystem is fast or slow. If the cache subsystem is fast and has a small delay characterization, then no WAIT states are included in the next cycle, and thus no additional clock cycle is required. However, if the device delay information indicates that the cache subsystem is slow, then the SLOW signal is asserted high and a WAIT state is incorporated to provide enough time for the tag compare cycle to be performed. This enables state transition logic in a device to take advantage of the particular delay characterization of the device in which the logic is embedded. It is also noted that the apparatus described in U.S. patent application Ser. No. 08/102,446 (DC-00426) title "Method and Apparatus for Synchronous Bus Interface Optimization," which is incorporated herein by reference, can be included with the logic according to the present invention to further increase performance.

Therefore, where a respective device has a small device delay characterization and thus is considered a "fast" chip, and the device includes logic according to the present invention, the device can perform operations in a reduced number of clock cycles. This significantly increases computer system performance.

Although the method and apparatus of the present invention has been described in connection with the preferred embodiment, it is not intended to be limited to the specific form set forth herein, but on the contrary, it is intended to cover such alternatives, modifications, and equivalents, as can be reasonably included within the spirit and scope of the invention as defined by the appended claims.

We claim:

1. A method for increasing device operation performance, wherein the device operates according to a clocking signal and includes circuitry which samples a first signal propagating through a first signal path in the device and a device delay encoder that encodes the delay characteristic of the device, the method comprising:

generating a clocking signal with first and second edges;

sampling, through operation of the device delay encoder, a second signal propagating through a second signal path including one or more logic elements in the device to determine a delay characteristic of the device;

representing said delay characteristic of the device by means of one or more bits indicating a fast or slow device; and operating said device to sample the first signal propagating through the first signal path on a first edge of said clocking signal if said one or more bits indicate a fast device; and operating said device to sample the first signal propagating through the first signal path on a second edge of said clocking signal after said first edge if said one or more bits indicate a slow device.

2. The method of claim 1, wherein said first signal propagating through said first signal path propagates through said first signal path in a greater amount of time than a period of said clocking signal in a slow device and propagates through said first signal path in a lesser amount of time than the period of said clocking signal in a fast device.

3. The method of claim 1, wherein said device delay encoder comprises:

a plurality of delay elements.

4. The method of claim 1, wherein said device delay encoder comprises:

a plurality of delay elements 1–N connected together, wherein the output of one delay element is connected to the input of a subsequent delay element, wherein the input delay element 1 receives said clocking signal.

5. The method of claim 1 wherein the device includes a cache; and the method further includes operating the cache such that information is loaded into the cache after a wait state if the one or more bits indicate a slow device; and operating the cache such that the information is loaded into the cache without a wait state if the one or more bits indicate a fast device.

6. The method of claim 1, wherein the representing the delay characteristic comprises:

representing the delay characteristic of the device by a bit indicating a slow device if the second signal propagates through the second signal path in an amount of time greater than a period of the clocking signal; and representing the delay characteristic of the device by a bit indicating a fast device if the second signal propagates through the second signal path in an amount of time less than the period of the clocking signal.

7. The method of claim 4, wherein said device delay encoder further comprises:

a plurality of memory elements 1–N having inputs connected to the outputs of said delay elements 1–N, wherein said memory elements each include a clock input which receives said clocking signal, wherein said memory elements sample said outputs of said delay elements at an edge of said clocking signal to determine a number of said delay elements through which an edge prior to said clocking signal has propagated through said delay elements 1–N.

8. A computer device which self-determines its own delay characteristics to increase the performance of circuitry in the device, relative to a clocking signal having first and second edges, the device comprising:

a device delay encoder coupled to sample a first signal propagating through one or more logic elements in the device to determine the delay characteristic of said one or more logic elements and coupled to encode said delay characteristic into device delay information, wherein said device delay information is a one bit value indicating a fast or slow device;

circuitry including an input coupled to sample a second signal propagating in the device and an input coupled to said device delay encoder to receive said device delay information, the circuitry sampling said second signal propagating in the device on a first edge of said clocking signal if said one bit value indicates a fast device, the circuitry sampling said second signal propagating in the device on a second edge of said clocking signal after said first edge if said one bit value indicates a slow device.

9. The computer device of claim 8, wherein said device delay encoder comprises:

a plurality of delay elements.

10. The computer device of claim 8, wherein said device delay encoder comprises:

a plurality of delay elements 1–N connected together, wherein the output of one delay element is connected to the input of a subsequent delay element, wherein the input of delay element 1 receives said clocking signal.

11. The computer device of claim 8 wherein the circuitry includes a cache system;

the at least one signal propagating in the device includes information for storage within the cache system; and the second edge of the clocking signal occurs after a cache system wait state.

12. The computer device of claim 10, wherein said device delay encoder further comprises:

a plurality of memory elements 1–N having inputs connected to the outputs of said delay elements 1–N, wherein said memory elements each include a clock input which receives said clocking signal, wherein said memory elements sample said outputs of said delay elements at an edge of said clocking signal to determine a number of said delay elements through which an edge prior to said edge of said clocking signal has propagated through said delay elements 1–N.

13. The computer device of claim 11 wherein the computer device is an integrated circuit coupled within a computer system, the computer system including a processor and a memory, the cache system including a cache controller and a cache memory, the memory providing information to the cache memory under control of the cache controller.

14. A digital electronic device which operates according to a state machine, said device capable of encoding delay characteristics associated with said device to increase performance of said state machine operations relative to a clocking signal having first and second edges, said device comprising:

a delay encoder coupled to said state machine for monitoring said delay characteristics associated with said device and for encoding said delay characteristics associated with said device as delay information;

circuitry which operates according to the state machine, wherein said circuitry includes a present state of said state machine and a next state of said state machine, wherein said circuitry includes an input coupled to said delay encoder which receives said delay information which is a one bit value indicating a fast or slow device;

wherein said circuitry determines its next state depending on its present state, and on the content of said delay information, wherein said circuitry advances from said present state of said state machine to said next state of said state machine with reference to a first edge of said clocking signal at a first time if said delay information indicates a fast device and said circuitry advances from said present state of said state machine to said next state of said state machine with reference to a second edge of said clocking signal at a second time later than said first time if said delay information indicates a slow device.

15. The digital electronic device of claim 14, wherein said delay encoder comprises:

a plurality of delay elements.

16. The digital electronic device of claim 14, wherein said delay encoder comprises:

a plurality of delay elements 1–N connected together, wherein the output of one delay element is connected to the input of a subsequent delay element, wherein the input of delay element 1 receives said clocking signal.

17. The digital electronic device of claim 14 wherein the circuitry advances from the present state of the state machine to the next state of the state machine if the delay information indicates a fast device; and the circuitry advances from the present state of the state machine to a wait state of the state machine to the next state of the state machine if the delay information indicates a slow device.

18. The digital electronic device of claim 16, wherein said delay encoder further comprises:

a plurality of memory elements 1–N having inputs connected to the outputs of said delay elements 1–N, wherein said memory elements each include a clock input which receives said clocking signal, wherein said memory elements sample said outputs of said delay elements at an edge of said clocking signal to determine a number of said delay elements through which an edge prior to said edge of said clocking signal has propagated through said delay elements 1–N.

19. A method for increasing operation performance of a device, the device being clocked by a clocking signal having first and second edges, the second edge occurring after the first edge, the device including circuitry for sampling a first signal propagating in a functional path of the device and a device delay encoder, the device delay encoder including a plurality of logic elements coupled within a delay signal path of the device and a plurality of outputs, the plurality of outputs being coupled to at least some of the logic elements, the method comprising:

propagating a second signal through the delay signal path:

sampling the plurality of outputs to provide a plurality of delay sample signals;

encoding the delay sample signals into a delay information bit, the delay information bit indicating a fast or slow device;

operating the device to sample the first signal propagating in the functional path of the device on the first edge of the clocking signal if the delay information bit indicates a fast device; and operating the device to sample the first signal propagating in the functional path of the device on the second edge of the clocking signal if the delay information bit indicates a slow device; wherein the device includes a cache system;

the first signal propagating in the device includes information from a memory provided to the cache system;

the cache system includes a cache controller; and the method further includes asserting by the cache controller a bus ready signal on the first edge of the clocking signal if the delay information bit indicates a fast device; and asserting by the cache controller a bus ready signal on the second edge of the clocking signal if the delay information bit indicates a slow device.

\* \* \* \* \*